(12) United States Patent
Rabinowitz

(10) Patent No.: US 7,077,361 B1
(45) Date of Patent: Jul. 18, 2006

(54) MICRO-OPTICS CONCENTRATOR FOR SOLAR POWER SATELLITES

(76) Inventor: Mario Rabinowitz, 715 Lakemead Way, Redwood City, CA (US) 94062

( * ) Notice: Subject to any disclaimer, the term of this patent is extended or adjusted under 35 U.S.C. 154(b) by 0 days.

(21) Appl. No.: 11/047,320

(22) Filed: Jan. 31, 2005

(51) Int. Cl.
*B64G 1/44* (2006.01)
(52) U.S. Cl. .................................. 244/172.8
(58) Field of Classification Search ............ 244/172.8; 136/246, 259, 244
See application file for complete search history.

(56) References Cited

U.S. PATENT DOCUMENTS

| | | | | |
|---|---|---|---|---|
| 3,466,119 A | * | 9/1969 | Giovanni | 359/851 |
| 3,781,647 A | * | 12/1973 | Glaser | 322/2 R |
| 3,933,323 A | * | 1/1976 | Dudley et al. | 244/1 R |
| 4,368,415 A | * | 1/1983 | Henderson et al. | 322/2 R |
| 4,371,135 A | * | 2/1983 | Keigler | 244/172.8 |
| 5,089,055 A | * | 2/1992 | Nakamura | 136/248 |
| 5,374,317 A | * | 12/1994 | Lamb et al. | 136/246 |
| 6,336,612 B1 | * | 1/2002 | Taormina et al. | 244/158.4 |
| 6,495,751 B1 | * | 12/2002 | Mikami et al. | 136/246 |
| 6,698,693 B1 | * | 3/2004 | Davidson et al. | 244/171.5 |
| 6,843,573 B1 | * | 1/2005 | Rabinowitz et al. | 359/851 |

* cited by examiner

*Primary Examiner*—Tien Dinh

(57) ABSTRACT

There is an increasingly intense need to harness solar energy due to an ever growing shortage of conventional energy sources, The instant invention is concerned with method and apparatus for solar concentrator micro-mirrors on solar power satellites and the moon to focus and reflect large quantities of solar energy. Method and apparatus are taught for directly reflecting solar energy to the Earth; reflecting solar energy to a microwave converter in space which transmits microwave energy to the Earth; and reflecting solar energy to a laser radiation converter which beams laser radiation to the Earth. The concentrated energy received at the Earth may be converted directly to electricity or indirectly by thermo-mechanical means. The advantages and disadvantages of the different means of sending such concentrated energy to the Earth are discussed. A particularly important objective of this invention is the focussing of sunlight for solar power conversion and production. The instant invention can contribute to the goal of achieving environmentally clean solar energy on a large enough scale to be competitive with conventional energy sources.

15 Claims, 6 Drawing Sheets

MICRO-OPTICS CONCENTRATOR FOR SOLAR POWER SATELLITES

INCORPORATION BY REFERENCE

The following U.S. patents, allowed patent applications, and pending patent applications are fully incorporated herein by reference:
1. U.S. Pat. No. 6,843,573 by Mario Rabinowitz and Mark Davidson "Mini-Optics Solar Energy Concentrator" issued on Jan. 18, 2005.
2. U.S. Pat. No. 6,738,176 by Mario Rabinowitz and Mark Davidson, "Dynamic Multi-Wavelength Switching Ensemble" issued on May 18, 2004.
3. U.S. Pat. No. 6,612,705 by Mark Davidson and Mario Rabinowitz, "Mini-Optics Solar Energy Concentrator" issued on Sep. 2, 2003.
4. U.S. Pat. No. 6,698,693 by Mark Davidson and Mario Rabinowitz, "Solar Propulsion Assist" issued on Mar. 2, 2004.
5. U.S. Publication #2003-0193726-A1 by Mark Davidson and Mario Rabinowitz, "Active Reflection, Illumination, and Projection" published on Oct. 16, 2003.
6. U.S. Publication #2005-0034750, by Mario Rabinowitz, "Spinning Concentrator Enhanced Solar Energy Alternating Current Production" is Pending.
7. U.S. Publication #2005-0087294, by Mario Rabinowitz, "Manufacturing Transparent Mirrored Mini-Balls for Solar Energy Concentration and Analogous Applications" is Pending.
8. U.S. Pat. No. 6,988,809, by Mario Rabinowitz, "Advanced Micro-Optics Solar Energy Collection System" is Pending.
9. U.S. Pat. No. 6,964,486, by Mario Rabinowitz, "Alignment of Solar Concentrator Micro-Mirrors" is Pending.
10. U.S. Pat. No. 6,957,894, by Mario Rabinowitz and Felipe Garcia, "Group Alignment Of Solar Concentrator Micro-Mirrors" is Pending.
11. U.S. Pat. No. 6,987,604, by Mario Rabinowitz and David V. Overhauser, "Manufacture and Apparatus for Nearly Frictionless Rotatable Array of Micro-Mirrors in a Solar Concentrator Sheet" is Pending.
12. U.S. Publication #2005-0195465, by Mario Rabinowitz, "Improved Micro-Optics Solar Energy Concentrator" is Pending.
13. U.S. Publication #2006-0012848, by Mario Rabinowitz, "Dynamic Reflection, Illumination, and Projection" is Pending.
14. U.S. Ser. No. 11/031,304, by Mario Rabinowitz, "Induced Dipole Alignment of Solar Concentrator Balls" is Pending.

BACKGROUND OF THE INVENTION

Due to pollution and resource attrition, conventional fossil fuel energy sources such as coal, oil, and natural gas must soon be supplanted by renewable power sources such as solar energy. However, solar energy has not always been directly available on Earth due to atmospheric conditions. Even during clear weather, the back-scattering by the atmosphere attenuates solar power from 1400 W/m$^2$ above the atmosphere to 1000 W/m$^2$, at best, on Earth. Because of scattering of light in the atmosphere, the diffuse component of the 1000 W/m$^2$ on Earth is not available for specular reflection from a concentrator to a conversion receiver. So depending on atmospheric conditions, air density fluctuations and composition, only a peak power density of about 850 W/m$^2$ may be available for conversion in a concentrator system on Earth. However the full 1400 W/m$^2$ is available in outer space to the micro-optics solar concentrator of the instant invention.

Even 1000 W/m$^2$ is not always available for direct conversion on Earth, depending on time and weather. Capturing the sun's energy with a Solar Power Satellite above the atmosphere can avoid both the problems of variable weather, and of sunlight scattering in all directions from the atmosphere. A full 1400 W/m$^2$ would be available for both direct conversion and for a concentrator system. This is one way that solar energy would be available in both good and bad weather.

The instant invention differs substantially from all previous Solar Power Satellite systems in the use of a micro-optics solar concentrator. In particular it differs from assemblages such as those of Glaser U.S. Pat. No. 3,781,647; Brown U.S. Pat. No. 3,989,994; Jung and Whalen U.S. Pat. Nos. 4,234,856 and 4,264,876; Preukschat U.S. Pat. No. 4,384,692; Fitch and Spencer U.S. Pat. No. 4,408,206; Copeland and Martin U.S. Pat. No. 4,415,759; and Simburger U.S. Pat. No. 6,127,621. None of these patents utilize a micro-optics solar concentrator. Nor do any of these patents teach or have the capability of directly reflecting and focussing sunlight to a receiver based on the ground. The U.S. Space Program successfully uses solar energy for power on board spacecraft. The instant invention enables the transmission of solar energy from orbiting satellites and even the moon to the Earth.

Definitions

"Bipolar" refers herein to either a magnetic assemblage with the two poles north and south, or an electric system with + and − charges separated as in an electret.

"Concentrator" as used herein in general is a micro-mirror system for focussing and reflecting light. In a solar energy context, it is that part of a solar Collector system that directs and concentrates solar radiation onto a solar Receiver.

"Concentration factor" is < or ~ of the ratio of the area of the concentrator to that of the area of the receiver. It is the factor such as 10×, 100×, etc. by which the solar flux is concentrated at the receiver relative to the ordinary solar flux.

"Dielectric" refers to an insulating material in which an electric field can be sustained with a minimum power dissipation. [Most transparent materials are dielectrics. However Indium/Tin Oxide (also called ITO in the literature) is a conductor that is also transparent.]

"Elastomer" is a material such as synthetic rubber or plastic, which at ordinary temperatures can be stretched substantially under low stress, and upon immediate release of the stress, will return with force to approximately its original length.

"Electret" refers to a solid dielectric possessing persistent electric polarization, by virtue of a long time constant for decay of charge separation.

"Element" or 'ball' or "cylinder" refers to the basic mirrored component of the instant invention which in a broad sense are spheroids and cylinders. The elements are transparent in the upper semi-sphere or semi-cylinder "Focussing planar mirror" is a thin almost planar mirror constructed with stepped varying angles so as to have the optical properties of a much thicker concave (or convex) mirror. It can heuristically be thought of somewhat as the projection of thin equi-angular segments of small portions of a thick mirror upon a planar surface. It is a focusing planar reflecting surface much like a planar Fresnel lens is a focusing transmitting surface. If a shiny metal coating is placed on a Fresnel lens it can act as a Fresnel reflector.

"Geosynchronous (geostationary) orbit" is a satellite orbit parallel to the Earth's equatorial plane at an altitude of 22,300 miles. such that a satellite moving East to West would be in synchronous rotation with the Earth so that it is stationary with respect to any point on the Earth.

"ITO" is a conducting alloy of Indium/Tin Oxide that is transparent.

"Laser" of the traditional kind, basically utilizes the natural frequencies of atoms or molecules between allowed energy levels for generating coherent electromagnetic radiation in the ultraviolet, visible, or infrared regions of the spectrum.

"Packing fraction" herein refers to the fraction of an available area occupied by the collection (ensemble) of rotatable elements.

"Receiver" as used herein in general is a system for receiving reflected light. In a solar energy context, it receives concentrated solar radiation from the micro-mirror assembly for the conversion of solar energy into more conveniently usable energy such as electricity.

"Thermoplastic" refers to materials with a molecular structure that will soften when heated and harden when cooled. This includes materials such as vinyls, nylons, elastomers, fuorocarbons, polyethylenes, styrene, acrylics, cellulosics, etc.

"Zeta potential," is the net surface and volume charge that lies within the shear slipping surface resulting from the motion of a body through a liquid. It is an electrical potential that exists across the interface of all solids and liquids. It is also known as the electrokinetic potential. The zeta potential produces an electric dipole moment (field) of a spherical body when it is made from two dielectrically different hemispheres due to the interaction of the sphere with the fluid that it is immersed in.

SUMMARY OF THE INVENTION

This invention provides a means for reducing the cost of solar energy derived from solar power satellites by utilization of a micro-optics solar concentrator that is both lightweight and low cost. The technology disclosed in the instant invention makes available large quantities of power that can be transmitted from space to the Earth from either man-launched orbiting satellites or the moon. In the various embodiments of this invention solar power can be directly reflected to the Earth by the concentrator; enabled conversion by the concentrator to microwaves which are radiated to the Earth; or enabled conversion by the concentrator, and then beamed by lasers to the Earth. The advantages and disadvantages of these approaches will be given in conjunction with the detailed description of these embodiments.

In addition to the ability to reflect light directly to the Earth, the micro-optics solar concentrator of this invention provides a low cost means for achieving affordable solar energy by greatly reducing the weight and cost of solar concentrators which increase (concentrate) the density of solar energy incident on the solar energy converters in a satellite. A limiting factor in the utilization of solar energy is the high cost of energy converters such as photovoltaic cells. For example, for the purpose of generating electricity, a large area of expensive solar cells may be replaced by a small area of high-grade photovoltaic solar cells operating in conjunction with the inexpensive intelligent micro-optics of this invention. Thus the instant invention can contribute to the goal of achieving environmentally clean energy on a large enough scale to be competitive with conventional energy sources.

The rotatable elements of this invention are mirrored balls and cylinders that are transparent in the upper semi-sphere or semi-cylinder. As derived in U.S. Pat. No. 6,843,573 of which the inventor of this instant invention is the co-inventor, balls in a square array have a packing fraction of 0.785 and 0.907 in an hexagonal array. Balls have an advantage over cylinders in that they can operate in either a single-axis or two-axis tracking mode. Cylinders have an advantage over balls in that they can have a packing fraction of nearly 1, but they are limited to a single-axis tracking mode.

The micro-mirrors of this invention may be aligned by a wide variety of embodiments using electomagnetically inter-active materials such as electret, optoelectric, conducting, thermoelectric, electrophoretic, zeta potential, resistive, semiconductive, insulating, piezoelectric, magnetic, ferro-magnetic, paramagnetic, diamagnetic, or spin (e.g. spin glass) materials. These different alignment means have many things in common, and each can be used to advantage depending on circumstances. These different embodiments have never been used or taught for a solar concentrator, though most are well-known in other fields. My novel induced dipole method of alignment is a preferred embodiment since no electret or magnet needs to be embedded in the balls, thus simplifying the manufacturing process and reducing costs. It is similarly advantageous over the zeta potential method which requires that the balls each be made from two dielectrically different hemispheres. In conjunction with FIGS. 5, 6, and 7, for specificity I will describe in detail my novel induced dipole method of alignment which uses just one dielectric material. From this specific case the reader may understand the general idea of how alignment works, and also gain an insight into how other methods operate.

A preferred embodiment of the instant invention achieves alignment by the induced dipole alignment of solar concentrator balls such that the dipole that is induced in the dielectric material surrounding a mirror acts in harmony with the induced dipole in each mirror. An external applied electric field E induces a dipole by polarizing the dielectric to partially cancel the field E inside the dielectric. In an applied electrostatic field, E, a dipole moment is induced in the metallic conducting material of the micro-mirrors because the charge distributes itself so as to produce a field free region inside the conductor. To internally cancel the applied field E, free electrons move to the end of each conducting mirror antiparallel to the direction of E, leaving positive charge at the end that is parallel to the direction of E. The electrostatic field induces and aligns the electrostatic dipoles of the dielectric and mirrors in a way somewhat analogous to an induced magnetic dipole in a pivoted ferromagnetic material in a magnetic field. When pivoted, a high aspect ratio (length to thickness ratio) ferromagnetic material becomes polarized and rotates to align itself parallel to an external magnetic field. Similarly an electrostatic field polarizes and aligns each dielectric ball and mirror. The mirror has a high aspect ratio of diameter to thickness. The ball is bifurcated into two semi-balls, each of which has a high aspect ratio of diameter to thickness.

The instant invention obviates or minimizes the major disadvantages associated with direct collection and conversion of solar energy on the Earth. There are many objects, aspects, and applications of this invention. Broadly this invention deals with the general concept of method and apparatus for focussing solar energy from solar power satellites to the Earth by using an on-board micro-mirror concentrator in any of a number of embodiments. A particularly important object is the focussing and transmission of solar energy from space for power conversion and production on Earth. Accordingly, other aspects and advantages are given below.

A particularly important aspect is to provide a satellite direct reflection and focussing system for solar radiation.

Another aspect is to provide a low cost, light-weight micro-optics concentrator on board a satellite for the conversion of solar energy to microwaves.

Another aspect is to provide a low cost, light-weight micro-optics concentrator on board a satellite for the conversion of solar energy to laser coherent radiation.

Another aspect is to provide a rugged satellite system for conversion of solar energy to heat.

Another aspect is to provide a light-weight micro-optics concentrator that can be utilized in the transmission of solar energy from the moon.

Another aspect is to provide large-scale environmentally clean energy.

Another aspect is to help in the industrialization of developing countries.

Another aspect is to provide a low-cost, tough, light-weight, concentrated efficient solar energy converter that is highly portable.

Another aspect is to provide a miniaturized quasi-planar heliostat field configuration that can track the sun.

Another aspect is to provide a portable system that can easily go anywhere man can go, to track and concentrate the sun's energy.

Other aspects, objects and advantages of the invention will be apparent in a description of specific embodiments thereof, given by way of example only, to enable one skilled in the art to readily practice the invention as described hereinafter with reference to the accompanying drawings.

DETAILED DESCRIPTION OF THE PRESENTLY PREFERRED EMBODIMENTS

Figure 1:
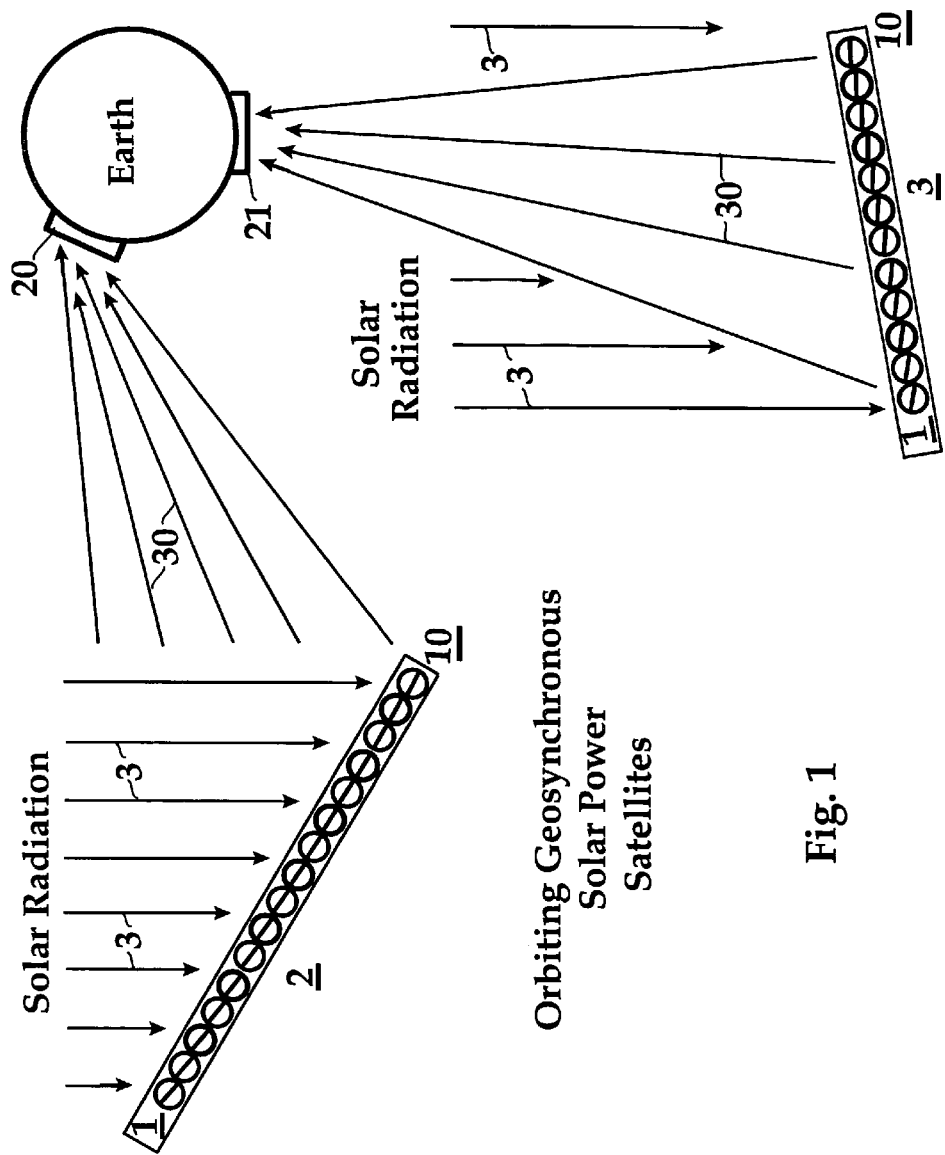
FIG. 1 is a perspective view showing two solar power reflecting satellites which orbit the Earth, and are equipped with micro-optics solar concentrators to directly reflect and focus solar energy to the Earth.

FIG. 1 is a perspective view (not drawn to scale) showing a solar power reflecting satellite 2 which orbits the Earth, and is equipped with a micro-optics solar concentrator 10 containing rotatable elements 1 to intercept solar radiation 3 and directly reflect the solar radiation as a focussed beam 30 to a receiving station 20 on the Earth. The rotatable elements 1 are balls or cylinders that are preferably less than 1 mm in radius, and are transparent in the upper semi-sphere or semi-cylinder. The rotatable elements 1 containing micro-mirrors as described in conjunction with FIGS. 5a to 5d are aligned in part by grid lines of wire electrodes 6t as described in conjunction with FIGS. 7a and 7b. A second orbiting solar power reflecting satellite 3 is similarly equipped with a micro-optics solar concentrator 10 to intercept solar radiation 3 and directly reflect this solar radiation 3 as a focussed beam 30 to another receiving station 21 (or the same station 20) on the Earth. The satellites 2 and 3 are preferably in geosynchronous (geostationary) orbits and about 8000 miles apart. Such orbits would keep both satellites above the horizon in direct view of the sun, and both would have a direct line of sight to the same receiving station 20, when it is desirable to send to the same station. Intelligent computer-aided steering with feedback, such a was used in the Lunar Ranging experiments can guide the focussed light beam 30. In case of mis-steering of the reflected light 30, the micro-optics solar concentrator 10 can be quickly de-focussed to greatly reduce the power level of this beam 30.

The receiving station 20 on the Earth would be equipped with a receiver for conversion of the solar beam 30 to heat and then electricity, or directly to electricity, etc. The receiving station 20 could also have a micro-optics concentrator to reflect and focus the beam 30 onto a receiver. The electricity thus obtained could then be transmitted over superconducting, cryogenic, or ordinary transmission lines, The direct reflection and focussing of solar radiation is preferred when it is desired to reduce the weight and cost of the solar power satellite. The simplicity, light weight, and low cost of direct reflection and focussing by the micro-optics solar concentrator 10 is its main advantage. It is simpler, less costly, and less vulnerable to failure than systems that transmit microwaves or laser beams from the satellites since no conversion equipment is needed on the satellite. It is also more efficient in the power sent from the satellite, as no energy conversion takes place on the satellite. However this needs to be judged relative to some disadvantages of such a direct reflection and focussing system. Some of the disadvantages are attenuation by the atmosphere, and that an optical beam is vulnerable to weather conditions such as clouds. The weather related disadvantages are somewhat ameliorated by having two or more solar power satellites with two or more receiving stations. Furthermore, since it is not necessary to convert energy at the satellite, this somewhat makes up for atmospheric attenuation. Microwave and laser systems require conversion of solar energy at the satellite and then conversion again of the energy radiated to the Earth.

Figure 2:
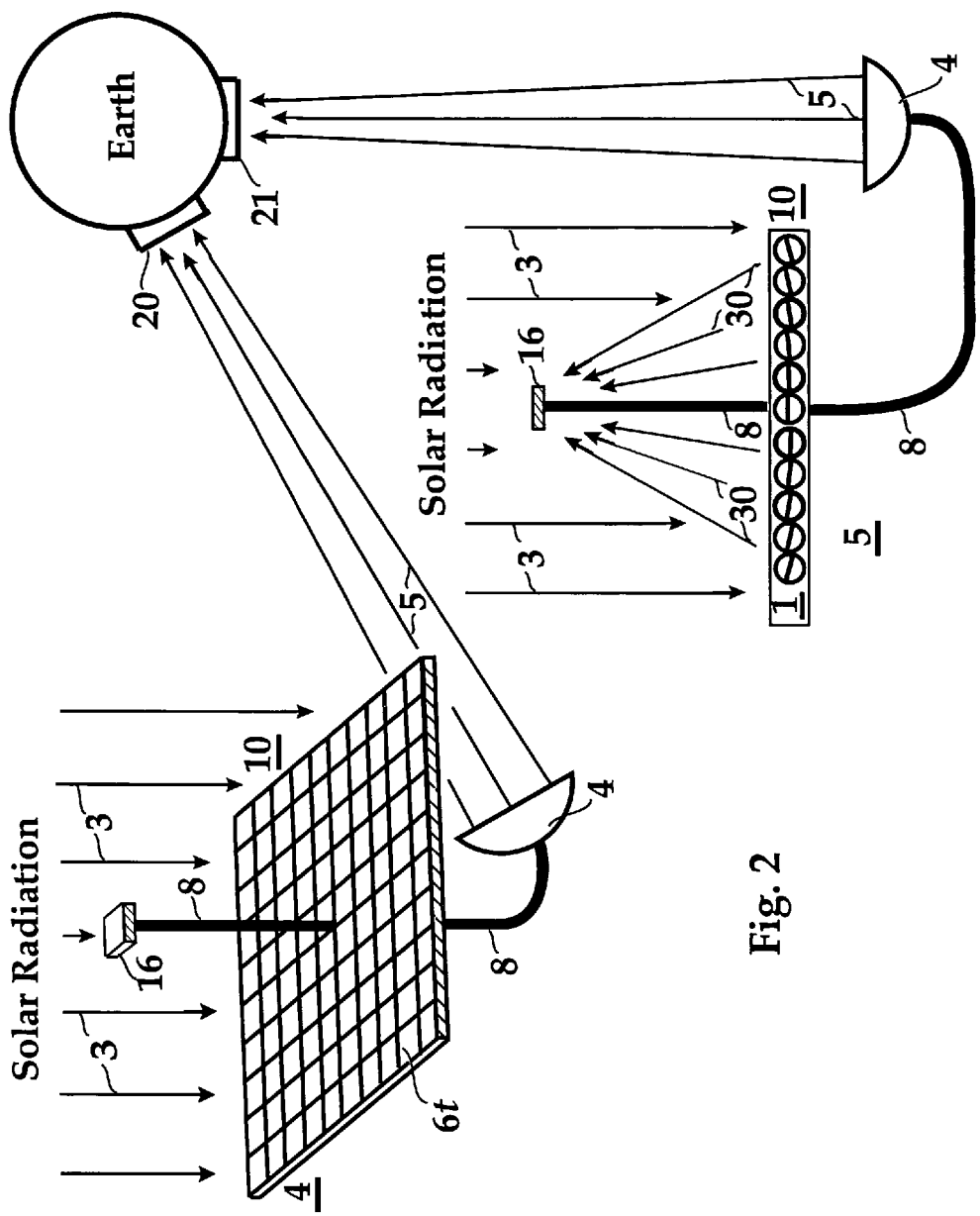
FIG. 2 is a perspective view showing two solar power satellites which orbit the Earth, and are each equipped with a micro-optics solar concentrator to reflect and focus solar energy to an energy converter which then powers a microwave transmitter to radiate energy to the Earth.
Figure 5A:
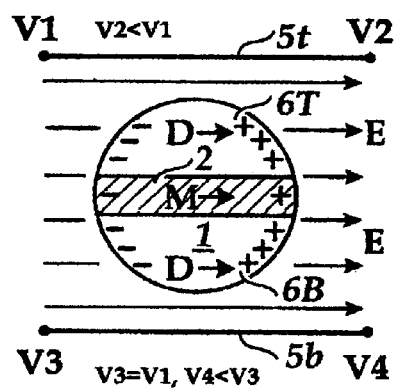
FIG. 5a is a cross-sectional view of a rotatable element consisting of an induced dipole mirror sandwiched between induced dipole dielectric semi-balls (semi-spheres or semi-cylinders), aligned parallel to partitioned electrodes where an ensemble of such elements are a major constituent of a micro-optics concentrator.
Figure 5B:
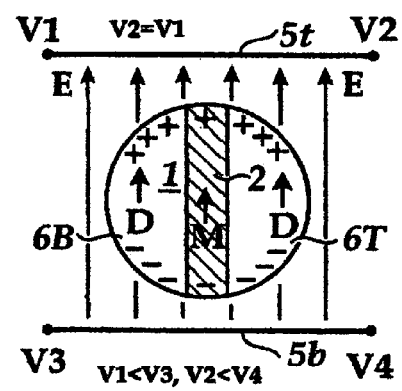
FIG. 5b is a cross-sectional view of a rotatable element consisting of an induced dipole mirror sandwiched between induced dipole dielectric semi-balls (semi-spheres or semi-cylinders), aligned perpendicular to partitioned electrodes where an ensemble of such elements are a major constituent of a micro-optics concentrator.
Figure 5C:
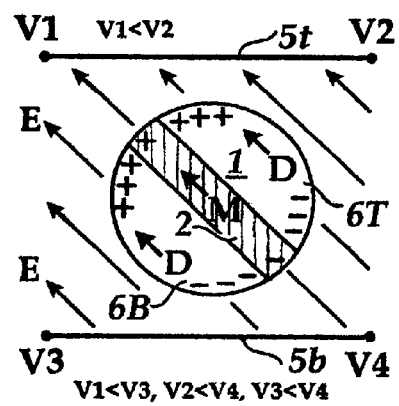
FIG. 5c is a cross-sectional view of a rotatable element consisting of an induced dipole mirror sandwiched between induced dipole dielectric semi-balls (semi-spheres or semi-cylinders), aligned at a tilted angle with respect to partitioned electrodes where an ensemble of such elements are a major constituent of a micro-optics concentrator.

FIG. 2 is a perspective view (not drawn to scale) showing a solar power reflecting satellite 4 which orbits the Earth, and is equipped with a micro-optics solar concentrator 10 containing rotatable elements to intercept solar radiation 3 and reflect the solar radiation 3 as a focussed beam to a receiver/converter 16 on the satellite 4. The rotatable elements 1 are balls or cylinders that are preferably less than 1 mm in radius, and are transparent in the upper semi-sphere or semi-cylinder The rotatable elements 1 containing micro-mirrors as described in conjunction with FIGS. 5a to 5d are aligned in part by grid lines of wire electrodes 6t as described in conjunction with FIGS. 7a and 7b. The elements 1 (mid-plane mirrored balls and cylinders) may be individually oriented as shown in FIGS. 5a to 5c, or groups may be collectively aligned to simplify tracking and focusing. Different groups are given different orientations to achieve focusing. The number of mirrors per grid cell are a design variable. The voltages can be controlled by a small micro-processor (computer) with analog voltage outputs. The micro-optics solar concentrator 10 is shown as a square array that can conveniently be put together in modular form along the grid lines 6t. However, other shapes of the concentrator 10 such as circular and oval may also be used.

An articulated pole 8 supports the receiver/converter 16. As shown, the articulated pole 8 allows the earth pointing transmitter to remain pointing to the earth while the micro-optics solar concentrator 10 is kept pointing to the sun. When the receiver/converter 16 is a solar photovoltaic receiver/converter, the pole 8 can serve double duty to advantage as both a receiver support and conduit for electrical wiring to and from the receiver/converter 16. The receiver/converter is preferably above the center of the micro-optics concentrator 10, positioned at a height about equal to that of ½ the concentrator 10 diagonal length making an approximately 45 degree angle from it to the corners of the concentrator 10. The conduit pole 8 has electrical cables in it, which bring electricity produced by the receiver/converter 16 to operate the microwave transmitter 4 which transmits a microwave beam 5 to the receiving station 20 on Earth. In case of mis-steering of the microwave beam 5, the micro-optics solar concentrator 10 can be quickly defocused to greatly reduce the power level of the transmitted microwave beam 5.

A second orbiting solar power reflecting satellite 5 is similarly equipped with a micro-optics solar concentrator 10 to intercept solar radiation 3 and reflect and focus this solar radiation 3 as a focussed beam 30 to a receiver/converter 16 on the satellite 5. An articulated pole 8 supports the receiver/converter 16. As shown, the articulated pole 8 allows the earth pointing transmitter to remain pointing to the earth while the micro-optics solar concentrator 10 is kept pointing to the sun. The pole 8 can serve double duty to advantage as both a receiver support and conduit for electrical wiring to and from the receiver/converter 16. The receiver is preferably above the center of the micro-optics concentrator 10, but may also be at any position with respect to the micro-optics concentrator 10. The conduit pole 8 carries energy from the receiver/converter 16 to power the microwave transmitter 4 which transmits a microwave beam to a receiving station 21, or the same station 20 on Earth. The satellites 4 and 5 are preferably in geosynchronous orbits and about 8000 miles apart. Such orbits would keep both satellites above the horizon in direct view of the sun, and both would have a direct line of sight to the same receiving station 21, when it is desirable to send to the same station.

Both in orbit and on Earth, conversion of the solar energy can be accomplished by any of a number of means such as photovoltaic, thermoelectric, and thermo-mechanical such as with a Stirling heat engine or turbo-based Rankine cycle solar generators. Basically these turbo-generators can consist of a closed loop working fluid that is heated to high temperature and pressure through the micro-mirror solar concentrator system of the instant invention. Direct mechanical work can thus be done, and electricity can thus be generated to power the microwave transmitters on the satellites.

An advantage of microwaves is that they can pass through the atmosphere with minimal attenuation. The minimal absorption and scattering of microwaves in the atmosphere makes them less vulnerable to the weather and clouds than visible radiation. This makes microwave transmission to the Earth from solar power satellites preferable to regions which have a great deal of inclement weather. However the disadvantage is one of capital and maintenance cost as well as weight.

Figure 3:
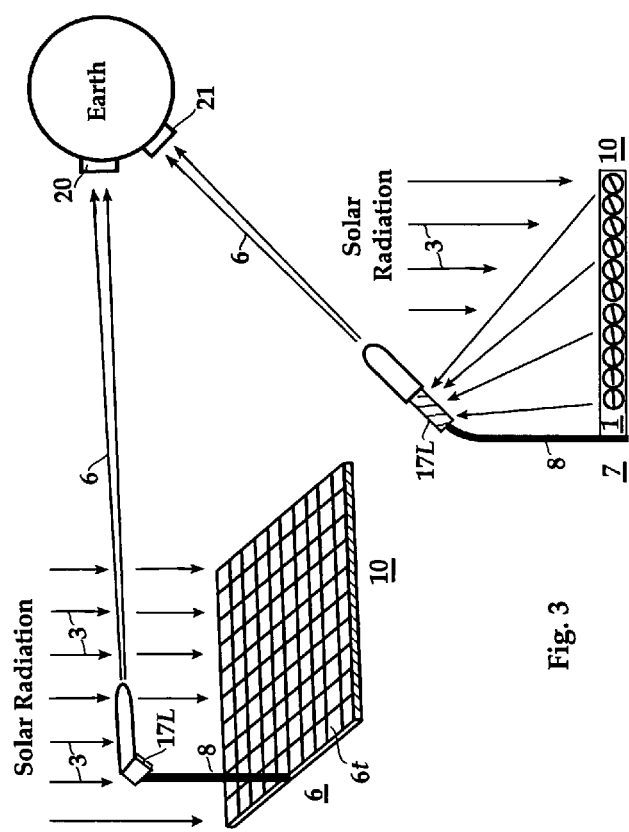
FIG. 3 is a perspective view showing two solar power satellites which orbit the Earth, and are each equipped with a micro-optics solar concentrator to reflect and focus solar energy to an energy converter which then powers a laser to beam energy to the Earth.

FIG. 3 is a perspective view (not drawn to scale) showing a solar power reflecting satellite 6 which orbits the Earth, and is equipped with a micro-optics solar concentrator 10 containing rotatable elements 1 to intercept solar radiation 3 and reflect the solar radiation 3 as a focussed beam to a laser 17L on the satellite 6. The elements 1 (mid-plane mirrored balls and cylinders) may be individually oriented as shown in FIGS. 5a to 5c, or groups may be collectively aligned to simplify tracking and focusing. Different groups are given different orientations to achieve focusing. The number of mirrors per grid cell are a design variable. The voltages can be controlled by a small micro-processor (computer) with analog voltage outputs. The rotatable elements 1 are balls or cylinders that are preferably less than 1 mm in radius, and are transparent in the upper semi-sphere or semi-cylinder. The micro-optics solar concentrator 10 is shown as a square array that can conveniently be put together in modular form along the grid lines 6t. However, other shapes of the concentrator 10 such as circular and oval may also be used.

An articulated pole 8 supports a laser 17L which can be directly pumped by the reflected radiation from the micro-optics solar concentrator 10. As shown, the articulated pole 8 allows the earth pointing transmitter to remain pointing to the earth while the micro-optics solar concentrator 10 is kept pointing to the sun. The laser 17L is preferably somewhat centered above the micro-optics concentrator 10, at a height such that an approximately 45 degree angle is made from it to the corners of the concentrator 10. The laser 17L transmits a well-collimated laser beam 6 to the receiving station 20 on Earth. Intelligent computer-aided steering with feedback, such a was used in the Laser Lunar Ranging experiments can guide the laser beam 6. In case of mis-steering of the laser beam 6, the micro-optics solar concentrator 10 can be quickly de-focussed to greatly reduce the power level of this beam 30; or the laser can be switched off.

Any of a number of different kinds of lasers may be used. Traditional lasers operate by atomic excitation. A collection of atoms is prepared so that there is a population inversion i.e. more atoms are initially excited than not. Then an incident light wave will stimulate more emission than absorption. This produces a net amplification of the incident light beam. The acronym LASER stands for Light Amplification by Stimulated Emission of Radiation. Population inversion can be achieved by concentrating light from the sun (or a flash lamp) onto the amplifying medium. Alternatively lasers may be used to optically pump other lasers. The free-electron laser operates by a different principle, which involves transit of electrons through a spatially varying magnetic field. This causes the electron beam to wiggle, and hence to radiate. The large Doppler frequency increase at relativistic electron speeds can be regulated. This permits tunable emission well beyond both sides of the visible with coherent radiation from the millimeter (well above the infrared) down to x-ray wavelength of hundreds of angstroms.

The laser preferably produces radiation in the red to infrared wavelengths of ~6000 Å to ~20,000 Å to minimize absorption and back-scatter in the atmosphere. Any of a number of different kinds of lasers may be used. For example a ruby laser producing red light ~7000 Å wavelength has been used for lunar ranging experiments in beaming light through the atmosphere, reflecting from an array of corner reflectors on the Moon, back through the atmosphere, and back to a detector on the Earth using only 1 Joule of energy per pulse. A neodynmium YAG (yttium aluminum garnet) laser produces infrared radiation 10,000 Å wavelength. An Argon ion laser could also be used.

A second orbiting solar power reflecting satellite 7 is similarly equipped with a micro-optics solar concentrator 10 to intercept solar radiation 3 and reflect and focus this solar radiation 3 as a focussed beam 30 to a laser 17L on the satellite 6. An articulated pole 8 supports a laser 17L which can be directly pumped by the reflected radiation from the micro-optics solar concentrator 10. The laser 17L is above the micro-optics concentrator 10. The laser 17L transmits a well-collimated laser beam 6 to the receiving station 20, or another station 21 on Earth. In case of mis-steering of the laser beam, the micro-optics solar concentrator 10 can be quickly defocused to greatly reduce the power level of the transmitted beam. Or the laser can be switched off. The satellites 6 and 7 are preferably in geosynchronous orbits and about 8000 miles apart. Such orbits would keep both satellites above the horizon in direct view of the sun, and both would have a direct line of sight to the same receiving station 21, when it is desirable to send to the same station.

Lasers are preferable because they produce a nicely collimated beam. A low power level laser signal can be used for aiming to the Earth receiver 20 or 21 before the power level is increased to full capacity. Another advantage of laser radiation of red or longer wavelength is that it can pass through the atmosphere with little attenuation. This is why the setting sun looks red, as the red and longer wavelengths pass through the greater travel distance via the atmosphere, and the shorter wavelengths are back-scattered and absorbed. The minimal absorption and scattering of long wavelength laser beams in the atmosphere makes them less vulnerable to the weather and clouds than visible radiation. However the disadvantage is one of capital and maintenance cost as well as weight.

Figure 4:
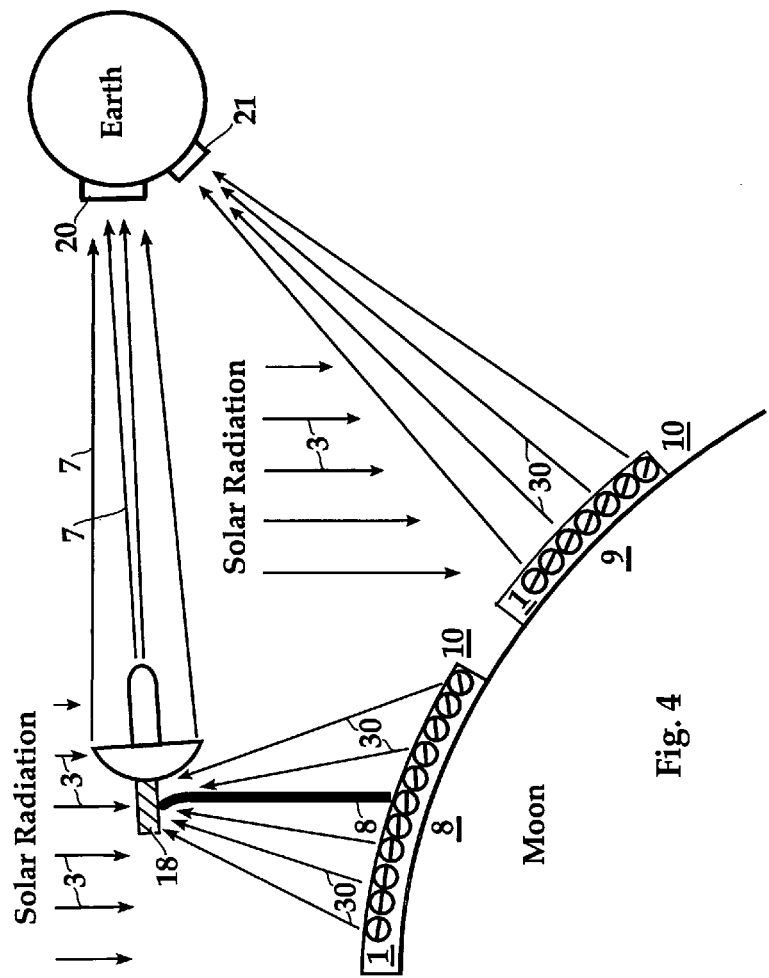
FIG. 4 is a perspective view showing our moon equipped with a micro-optics solar concentrator to reflect and focus solar energy to an energy converter which then powers a microwave or laser beam to energize the Earth. Also shown is direct refection and focussing of solar energy to the Earth by means of a second micro-optics solar concentrator.

FIG. 4 is a perspective view (not drawn to scale) showing a micro-optics solar concentrator 10 containing rotatable elements 1 to intercept solar radiation 3 and reflect the solar radiation 3 as a focussed beam to a Laser and/or microwave transmitter 18 on our Moon, which is our natural satellite. The rotatable elements 1 are balls or cylinders that are preferably less than 1 mm in radius, and are transparent in the upper semi-sphere or semi-cylinder. An articulated pole 8 supports a transmitter 18 which can be directly pumped by the reflected radiation from the micro-optics solar concentrator 10 when the transmitter 18 is a laser. When the transmitter 18 is a microwave transmitter, the solar energy reflected from the micro-optics solar concentrator 10 is first converted to electrical energy which is then converted to microwaves. The transmitter 18 is preferably above the center of the micro-optics concentrator 10 positioned at a height about equal to that of ½ the concentrator 10 diagonal length making an approximately 45 degree angle from it to the corners of the concentrator 10. The transmitter 18 transmits a collimated beam 7 to the receiving station 20 on Earth.

Also shown in FIG. 4 is a second micro-optics solar concentrator 10 containing rotatable elements 1 which intercept solar radiation 3 and reflect the solar radiation 3 as a focussed beam of light to a receiving station 21 on Earth.

FIG. 5a is a cross-sectional view of a rotatable element 1 with a micro-mirror 2 aligned parallel to top partitioned highly resistive electrode 5t and bottom partitioned highly resistive electrode 5b, where an ensemble of such elements and electrodes are a major constituent of a micro-optics concentrator. The micro-mirror 2 is sandwiched between a dielectric top semi-ball 6T which must be transparent, and a bottom semi-ball 6B which is preferably transparent, but need not be. The micro-mirror 2 is a shiny circular flat conducting metal of thickness d close to the equatorial plane of the elements 1. The partitioned electrodes and other types of electrodes are discussed in conjunction with FIGS. 2a, 2b, 3a, and 3b. A micro-processor sends signals via bus bars to establish voltages from a power supply to each partitioned electrode which is made of a highly resistive thin transparent conductor such as an alloy of indium tin oxide (ITO). For top partitioned electrode 5t, the left corner is at voltage V1 and the right corner is at voltage V2. For bottom partitioned electrode 5b, the left corner is at voltage V3 and the right corner is at voltage V4. A signal sets the voltages so that V3=V1, V4=V2, V2<V1, and V4<V3, to produce an approximately uniform applied electric field E parallel to the electrodes 5t and 5b as shown.

The electric field E polarizes the semi-balls 6T and 6B with an induced dipole moment D with positive charge + on the right and − charge on the left as shown. Similarly, the applied electric field E also induces an electric dipole moment M in the metallic conducting material of the micro-mirror 2. This is because when a metallic conductor is placed in an electric field, the charge distributes itself so as to produce a field free region inside the conductor. To internally cancel the applied field E, negative-free electrons move to the end of each conducting micro-mirror 2 opposite to the direction of E, leaving positive + charge at the end in the direction of E. The torque interaction of the induced electric dipole moment D of the dielectric and M of the micro-mirror 2 and the dominant electric field E acts to align the micro-mirror 2 parallel to the electric field E as shown here in FIG. 5a. The torque is proportional to the product of E and the total vector dipole moment and will be analyzed following the detailed description of FIG. 1f. An electret(s) embedded in the dielectric may be used to augment the torque to overcome frictional effects.

The axis of symmetry of the elements 1 is perpendicular to the applied electric field because the micro-mirrors 2 and hence the induced polarization dipole field is perpendicular to the axis of symmetry. Here E is parallel to the equatorial plane of the balls and the top surface 5t which admits light.

FIG. 5b is a cross-sectional view of a rotatable element 1 with a micro-mirror 2 aligned perpendicular to top partitioned highly resistive electrode 5t and bottom partitioned highly resistive electrode 5b, where an ensemble of such elements and electrodes are a major constituent of a micro-optics concentrator. The micro-mirror 2 is sandwiched between a dielectric top semi-ball 6T which must be transparent, and a bottom semi-ball 6B. For top partitioned electrode 5t, the left corner is at voltage V1 and the right corner is at voltage V2. For bottom partitioned electrode 5b, the left corner is at voltage V3 and the right corner is at voltage V4. A signal sets the voltages so that V2=V1, V4=V3, V1<V3, and V2<V4, an approximately uniform applied electric field E is produced perpendicular to the electrodes 5t and 5b as shown. The micro-mirror 2 aligns itself parallel to the applied dominant electric field E due to the induced electric dipole moment D of the dielectric and induced electric dipole moment M of the micro-mirror 2, with positive charge + on the top and − charge on the bottom as shown.

FIG. 5c is a cross-sectional view of a rotatable element 1 with a micro-mirror 2 aligned at a tilted angle with respect to top partitioned highly resistive electrode 5t and bottom partitioned highly resistive electrode 5b, where an ensemble of such elements and electrodes are a major constituent of a micro-optics concentrator. The micro-mirror 2 is sandwiched between a dielectric top semi-ball 6T which must be transparent, and a bottom send-ball 6B. For top partitioned electrode 5t, the left corner is at voltage V1 and the right corner is at voltage V2. For bottom partitioned electrode 5b, the left corner is at voltage V3 and the right corner is at voltage V4. A signal sets the voltages so that V1<V2, V3<V4, V1<V3, and V2<V4, an approximately uniform applied electric field E is produced that is tilted with respect to the electrodes 5t and 5b as shown. The micro-mirror 2 aligns itself parallel to the applied dominant electric field E due to the induced electric dipole moment D of the dielectric and induced electric dipole moment M of the micro-mirror 2, with positive charge + and negative − charge at the ends as shown.

Figure 5D:
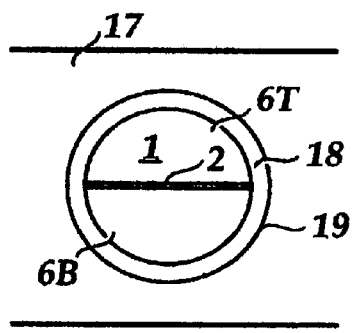
FIG. 5d is a cross-sectional view of a rotatable element with a micro-mirror sandwiched between dielectric semi-balls. These elements are completely surrounded by a lubricating fluid which is encapsulated inside a concentric cavity.

As shown in FIG. 5d the containment sheets 17 for holding the elements 1 may be made of a thermoplastic such as an elastomer. Examples of materials that are appropriate transparent dielectrics for making the elements 1 are: glass, polycarbonate, acrylic polymers made from acrylic derivatives such as acrylic acid, methacrylic acid, ethyl acrylate, methyl acrylate (some trade names are lexan, lucite, plexiglass, etc.). Glass is preferred for longevity in the ultraviolet environment of the sun, and low material cost. Its disadvantage is the higher cost of manufacturing equipment because of its high melting point and reactivity in the molten state. The above plastics are preferred because of their clarity (transparency) and ease of manufacture.

A rough and ready approximate equation for the torque on a mid-plane mirrored ball is $$\tau \approx \varepsilon V^2 [\frac{\pi}{4}d + (K-1)(\frac{\pi}{3}r - \frac{\pi}{4}d)], \qquad (1)$$

where τ is the torque in newton-meters, V is the applied grid voltage, r is the ball radius in meters, d is the mirror thickness in meters (d<2r), and K is the dielectric constant of the ball. For example 2<K<3 for Lucite. Both the mirror and the ball work together to contribute to the total torque. Depending on the relative values of d, r, and K, the mirror or the ball can dominate in the torque contribution. K=n where n is the index of refraction of the ball.

For a high packing density of balls, one needs to take into consideration the efficiency reduction due to blocking of light (shadowing) by one mirror on other. Worst case blocking is expected to occur when the incident light ray is normal to the concentrator and the exit ray is a grazing ray almost parallel to the plane of the concentrator at critical angle Θ, A worst case estimate for the efficiency factor f due to shadowing caused by high packing density is $$f \approx 1 - \sin \Theta \tan(\Theta/2), \qquad (2)$$

where Θ<π/2. The critical angle Θ for total internal reflection occurs for sin Θ=1/n. Θ is the angle of reflection of the light with respect to the normal of the concentrator mirror array surface in going to the receiver. If the receiver is moved towards the normal to the mirror array, the efficiency factor f approaches 1. The efficiency factor f also gets larger, the larger n is.

Since n≈√K, this is an incentive to use a dielectric for the balls with a large dielectric constant K to reduce shadowing effects. Fortunately nature is helpful here, as a larger K also produces a larger torque to align the balls as can be seen from the above torque equation (1). For large K>>1, the torque is approximately proportional to K so for example doubling K roughly doubles the torque, as can be seen from the torque equation (1). It is clearly preferable to use a dielectric for the balls with index of refraction n>1.2 and dielectric constant K>1.4. One has to be careful to use the high frequency value of K in converting to n, as n is for the extremely high frequencies for light. A low frequency value of K is adequate in the torque eq. (1).

Table 1 is indicative of the improvement in the efficiency factor by increasing the index of refraction or the dielectric constant of the ball, not to mention the increase of the torque for alignment. The numbers obtained from eq. (2) are approximate worst case.

TABLE 1

| n (Index of refraction) | f (Efficiency factor) | K (dielectric constant) |
|---|---|---|
| 1.2 | 0.553 | 1.44 |
| 1.3 | 0.639 | 1.69 |
| 1.4 | 0.700 | 1.96 |
| 1.5 | 0.745 | 2.25 |
| 1.6 | 0.781 | 2.56 |
| 1.7 | 0.809 | 2.89 |
| 1.8 | 0.831 | 3.24 |

FIG. 5d is a cross-sectional view of a rotatable element 1 with a micro-mirror 2. The micro-mirror 2 of thickness d is sandwiched between a dielectric top semi-ball 6T which must be transparent, and a bottom semi-ball 6B. The elements 1 are a major constituent of a micro-optics concentrator. The element 1 is completely surrounded by a lubricating fluid 18 which is encapsulated inside a concentric cavity 19. The cavities 19 are inside a transparent elastomer sheet 17, which is positioned between alignment electrodes as are described in conjunction with FIGS. 6a, 6b, 7a, and 7b. Thus the confined and lubricated element 1 can make a nearly frictionless rotation, with hardly any undesirable displacement. An ensemble of such elements can thus be aligned as a group with the application of moderate power. It is preferable to utilize a liquid 18 whose index of refraction matches the clear semi-sphere or clear semi-cylinder, and it should have the same density as element 1 to minimize buoyant forces. The index of refraction of the sheet 17, the liquid 18, and the optically transmissive upper portion of elements 1 should all be approximately equal. The elements 1 should be roughly balanced to minimize gross gravitational orientation.

In addition to controlling the torque as given by eq. (1), the micro-mirror thickness d and density $\rho_m$ can be varied to achieve a preferred overall density for the ball. The micro-mirror thickness is purposely shown thinner here than in the previous figures, to illustrate the achievement of a lower overall density. To reduce friction and other retarding forces, it is very important for the ball to match the density of the encompassing lubricating fluid 18 so that it will be buoyed up to float in the fluid and not sink to the bottom because it is too dense, or float to the top because its density is too low. It is also important for the dielectric of the ball to match the index of refraction of the encompassing lubricating fluid 18, and both should match the index of refraction of the sheet 17 which houses the balls (made of semi-balls 6T and 6B), fluid 18, and concentric cavities 19. It is not easy to find a dielectric material which meets both matching requirements of density and index of refraction. This is where being able to vary the thickness d and density $\rho_m$ of the mirror material becomes paramount.

In the case of a spherical ball, for a given density $\rho_m$ of the mirror, and density Pd of the dielectric, to match the fluid density $\rho_f$, the mirror thickness d should be $$d = \frac{\frac{4}{3}\pi r^3 (\rho_f - \rho_d)}{\pi r^2 (\rho_m - \rho_d)}. \tag{3}$$

In the case of a spherical ball, for a given mirror thickness d, and density $\rho_d$ of the dielectric, to match the fluid density $\rho_f$, the mirror density $\rho_m$ should be $$\rho_m = \frac{\frac{4}{3}\pi r^3 (\rho_f - \rho_d) + \pi r^2 d \, \rho_d}{\pi r^2 d}. \tag{4}$$

Matching the density of the fluid 18 by adjusting the mirror thickness and/or density has the advantage of maintaining gross symmetry in the balls, and is thus preferred as they will thus be roughly balanced to minimize gross gravitational orientation. Another way to match the density of the fluid 18 is to adjust the bottom semi-sphere density by adding or removing weight in voids in the bottom semi-sphere which need not be transparent.

Let us now look at various possible embodiments for the addressing electrodes. The different configurations shown, and combinations of them can operate to align the elements 1 and track the sun, or other light source in a non-solar application. A conducting, but highly resistive material like Indium/Tin Oxide (ITO) can be sputtered on the sheets that contain the elements 1 to form the addressing electrodes. The optical transparency of ITO makes it ideally suited for addressing the balls.

Figure 6A:
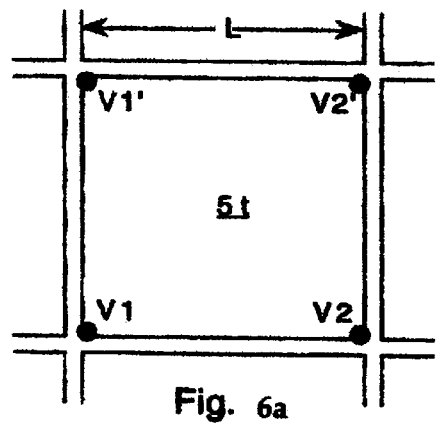
FIG. 6a represents a top view of an array of partitioned highly resistive electrodes showing in detail a top view of one such electrode and the voltages at its four corners.

FIG. 6a represents a top view of an array of partitioned highly resistive electrodes with grid spacing L showing in detail a top view of one such electrode 5t and the voltages at its four corners. Voltages V1 and V2 correspond to voltages V1 and V2 shown in the cross sectional FIGS. 1d, 1e, and 1f. Voltages V1' and V2' are the voltages at the corners of this top electrode 5t below the plane of the paper. Each partitioned electrode is made of a highly resistive thin transparent conductor such as an alloy of indium tin oxide (ITO).

Figure 6B:
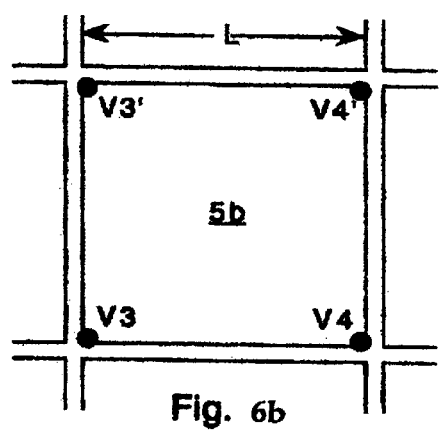
FIG. 6b represents a bottom view of an array of partitioned highly resistive electrodes showing in detail a view of a bottom electrode and the voltages at its four corners.

FIG. 6b represents a bottom view of an array of partitioned highly resistive electrodes with grid spacing L showing in detail a view of a bottom electrode 5b and the voltages at its four corners. Voltages V3 and V4 correspond to voltages V3 and V4 shown in the cross sectional FIGS. 1d, 1e, and 1f. Voltages V3' and V4' are the voltages at the corners of this bottom electrode 5b below the plane of the paper.

Figure 7A:
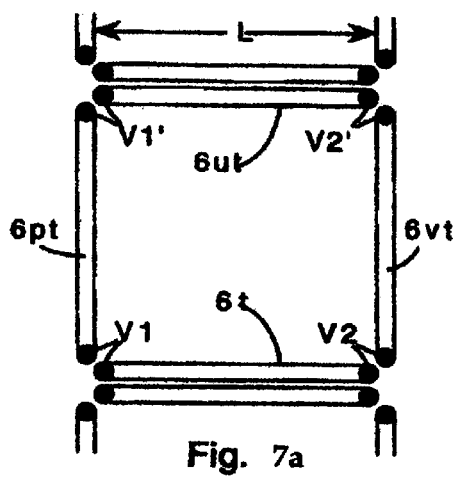
FIG. 7a represents a top view of an array of fragmented highly resistive wire electrodes showing in detail a top view of a set of four such adjacent electrodes and the voltages at their ends.

FIG. 7a represents a top view of an array of fragmented highly resistive wire electrodes with grid spacing L showing in detail a top view of a set of four such adjacent electrodes and the voltages at their ends. At the top, wire electrode 6t has voltages V1 and V2 at its ends which correspond to voltages V1 and V2 shown in the cross sectional FIGS. 1d, 1e, and 1f. Wire electrode 6pt is a wire perpendicular to the plane of the paper with voltages V1 and V1' at its ends. Wire electrode 6vt is a vertical wire with respect to the plane of the paper with voltages V2 and V2' at its ends. Wire electrode 6ut has voltages V1' and V2' at its ends, and is under the top electrode 6t. Each fragmented wire electrode is made of a highly resistive thin transparent conductor such as an alloy of indium tin oxide (ITO).

Figure 7B:
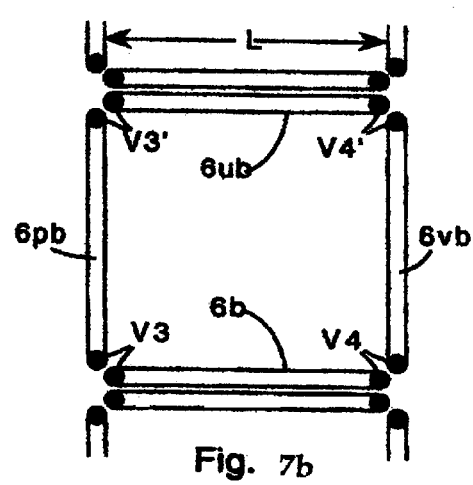
FIG. 7b represents a bottom view of an array of fragmented highly resistive wire electrodes showing in detail a bottom view of a set of four such adjacent electrodes and the voltages at their ends.

FIG. 7b represents a bottom view of an array of fragmented highly resistive wire electrodes with grid spacing L showing in detail a bottom view of a set of four such adjacent electrodes and the voltages at their ends. At the bottom, wire electrode 6b has voltages V3 and V4 at its ends which correspond to voltages V3 and V4 shown in the cross sectional FIGS. 1d, 1e, and 1f. Wire electrode 6pb is a wire perpendicular to the plane of the paper with voltages V3 and V3' at its ends. Wire electrode 6vb is a vertical wire with respect to the plane of the paper with voltages V4 and V4' at its ends. Wire electrode 6ub has voltages V4 and V4' at its ends, and is under electrode 6b.

Operational Modes

Let us consider various combinations of the electrodes and their advantages and disadvantages. The partitioned electrodes 5t and 5b of FIGS. 2a and 2b may be operated as a pair. The advantage of doing this is that the most approximately Uniform dominant electric fields may thus be created here with only a negligible amount of fringing fields at the edges. A disadvantage of this configuration is that it has the smallest optical transparency since the incident light must be transmitted and reflected through each partitioned electrode of, for example, transparent ITO.

Operating the fragmented wire electrodes of FIGS. 3a and 3b as a pair has the advantage of providing the greatest transparency since the wire electrodes have a small cross section with most of the light passing between them. Thus a larger percentage of the incident light will be reflected to the receiver. A disadvantage of this configuration is that it produces the least uniform electric fields. Yet because of symmetry, the components of the field that diverge from uniformity cancel, and a main component remains to align the elements (balls and cylinders) in the same direction as would be provided by the corresponding uniform electric field that partitioned electrodes would produce. This configuration has the further advantage that when the top side becomes worn or soiled, this configuration can be turned over so the pristine bottom side can be used on top with a high transparency to the incident and reflected light.

The presently preferred configuration is the fragmented wire electrodes of FIG. 7a on top to receive the light, combined with the partitioned electrodes of FIG. 7b on the bottom so that the combination more closely approximates the desired uniform dominant electric field. With the fragmented wire electrodes configuration on top, the same large percentage of the incident light will be reflected to the receiver as for the configuration of fragmented wire electrodes on both top and bottom.

In order to accomplish alignment economically, one can use a pulsed voltage source, when the elements 1 need only be aligned intermittently. The elements 1 (balls and cylinders) may be individually oriented, or groups may be collectively aligned to simplify tracking and focussing. When groups are collectively oriented, as a group they may have a projected group concavity to aid in the focussing to the receiver. The number of mirrors per grid cell are a design variable. The voltages can be controlled by a small microprocessor (computer) with analog voltage outputs.

There is a trade-off between complexity of the concentrator grid, and size of the power supply and control system. One element per grid cell is the maximum complexity of the concentrator grid and control system, and presents the minimal requirement for the power supply. Unlike displays that require high resolution, groups of balls may be collectively oriented to simplify tracking and focussing. When groups are collectively oriented as a group they may have a projected group concavity to aid in the focussing to the collector. Only intermittent alignment of the elements is necessary in the tracking of the sun, so a pulsed or step function voltage source may be used. An intermittent use of large voltage is much less difficult to achieve than the same steady state voltage.

Advantages of Outer Space Energy Collection

Not only is there more solar energy available above the atmosphere than on the Earth's surface in the best of circumstances, but the solar energy in orbit is nearly continuously available. Above the atmosphere 1400 W/m$^2$ is available compared with 1000 W/m$^2$ at sea level. The only satellite unavailability is the blackout associated with the equinoxes of about an hour.

A geosynchronous satellite would receive about an order of magnitude more solar energy than the most propitious locations on Earth. On Earth, ideal solar power locations— for example the Southwest in the United States—would be far from the major centers of power consumption. A geosynchronous solar power satellite could hover 22,300 miles above receiving stations close to major centers of power consumption—wherever they might be.

Non-geosynchronous satellites can operate in either of two modes. They can be switched off when they are out of line-of-sight from their respective receiving stations on Earth. Or alternatively, they can operate continuously by sequentially transmitting to a series of properly spaced receiving stations around the Earth. This would be about a 1500 mile East-West separation in the equatorial region. The angular separation of ~21° would remain the same as the latitudes move toward the poles, but the distance separation would be accordingly less.

Vicissitudes of nature such as earthquakes, gusts, rainstorms, and grime are essentially absent in the outer space environment compared with those on Earth. Combined with zero gravity, this makes possible large-scale structures that are much cheaper and lighter than those on Earth.

While the instant invention has been described with reference to presently preferred and other embodiments, the descriptions are illustrative of the invention and are not to be construed as limiting the invention. Thus, various modifications and applications may occur to those skilled in the art without departing from the true spirit and scope of the invention as summarized by the appended claims together with their full range of equivalents.

The invention claimed is:

1. Apparatus for converting solar energy in space to concentrated energy on Earth comprising;
    a) a satellite system with at least one geosynchronous satellite positioned such that said satellite is in energy receiving relationship to the sun;
    b) solar energy reflecting means comprising a concentrator array of micro-mirrors in rotatable elements embedded in individually encapsulating cavities in an optically transmissive sheet; and
    c) electromagnetic means for addressing and aligning said elements in said array.

2. An apparatus of claim 1 wherein said solar energy is directly reflected to Earth for energy utilization.

3. An apparatus of claim 1 wherein said solar energy is reflected by said array of micro-mirrors to a microwave converter which transmits microwave energy to the Earth for energy conversion.

4. An apparatus of claim 1 wherein said solar energy is reflected by said array of micro-mirrors to a laser radiation converter which beams laser radiation to the Earth for energy conversion.

5. An apparatus of claim 1 wherein said solar energy is reflected by said array of micro-mirrors to a laser radiation converter which beams laser radiation of wavelength longer than 5000 Å to the Earth for energy applications.

6. Apparatus for converting solar energy in space to concentrated energy on Earth comprising:
    a) a satellite system with at least one satellite positioned such that said satellite is in energy receiving relationship to the sun;
    b) solar energy reflecting means comprising a concentrator array of micro-mirrors in rotatable dielectric elements embedded in individually encapsulating cavities in an optically transmissive sheet; and
    c) induced electric dipole means for aligning said elements in said array.

7. An apparatus of claim 6 wherein said solar energy is directly reflected to Earth for energy utilization.

8. An apparatus of claim 6 wherein said solar energy is reflected by said array of micro-mirrors to a microwave converter which traits microwave energy to the Earth for energy conversion.

9. An apparatus of claim 6 wherein said solar energy is reflected by said array of micro-mirrors to a laser radiation converter which beams laser radiation to the Earth for energy applications.

10. An apparatus of claim 6 wherein said solar energy is reflected by said array of micro-mirrors to a laser radiation converter which beams laser radiation wavelength longer than 5000 Å to the Earth for energy conversion, of which the infrared wavelengths are within a non-attenuating band-pass in the earth's atmosphere.

11. An apparatus of claim 6 wherein an articulated pole allows an earth pointing transmitter to remain pointing to the earth while said concentrator array is kept pointing to the sun.

12. An apparatus of claim 6 wherein at least one satellite of said satellite system hovers at an altitude below geosynchronous orbit.

13. An apparatus of claim 6 wherein at least one non-geosynchronous satellites of said satellite system sequentially transmits energy to a series of successively spaced receiving stations around the Earth.

14. An apparatus of claim 1 wherein at least one satellite of said satellite system hovers at an altitude below geosynchronous orbit.

15. An apparatus of claim 1 wherein at least one non-geosynchronous satellites of said satellite system sequentially transmits energy to a series of successively spaced receiving stations around the Earth.

* * * * *